United States Patent
Yoo et al.

(10) Patent No.: US 7,432,534 B2
(45) Date of Patent: Oct. 7, 2008

(54) III-NITRIDE SEMICONDUCTOR LIGHT EMITTING DEVICE

(75) Inventors: Tae-Kyung Yoo, Yongin-si (KR); Chang Tae Kim, Seongnam-si (KR); Eun Hyun Park, Seongnam-si (KR); Soo Kun Jeon, Gunsan-si (KR)

(73) Assignee: Epivalley Co., Ltd., Kyunggi-do (KR)

( * ) Notice: Subject to any disclaimer, the term of this patent is extended or adjusted under 35 U.S.C. 154(b) by 223 days.

(21) Appl. No.: 10/544,271

(22) PCT Filed: Mar. 4, 2005

(86) PCT No.: PCT/KR2005/000618

§ 371 (c)(1),
(2), (4) Date: Aug. 3, 2005

(87) PCT Pub. No.: WO2005/086244

PCT Pub. Date: Sep. 15, 2005

(65) Prior Publication Data

US 2006/0261344 A1 Nov. 23, 2006

(30) Foreign Application Priority Data

Mar. 5, 2004 (KR) .................. 10-2004-0014895

(51) Int. Cl.
*H01L 27/15* (2006.01)

(52) U.S. Cl. .................. 257/85; 257/77; 257/E33.025; 257/E33.028; 257/E33.03; 257/E33.033

(58) Field of Classification Search .......... 257/E33.025, 257/E33.028, E33.03, E33.033, 77, 85
See application file for complete search history.

(56) References Cited

U.S. PATENT DOCUMENTS 5,122,845 A 6/1992 Manabe et al.

(Continued)

FOREIGN PATENT DOCUMENTS

JP 64-86572 3/1989

(Continued)

OTHER PUBLICATIONS

Nobuyuki et al., "Semiconductor Light Emitting Device and Its Manufacturing Method", Machine Translation of JP H10-084159, Mar. 31, 1998.*

*Primary Examiner*—Jerome Jackson
*Assistant Examiner*—Jay C Kim
(74) *Attorney, Agent, or Firm*—Husch Blackwell Sanders LLP

(57) ABSTRACT

The present invention relates to a III-nitride semiconductor light emitting device comprising a plurality of III-nitride semiconductor layers including an active layer emitting light by recombination of electrons and holes, the plurality of III-nitride semiconductor layers having a p-type III-nitride semiconductor layer at the top thereof, a $Si_aC_bN_c$ ($a \geq 0, b > 0, c \geq 0$) layer grown on the p-type III-nitride semiconductor layer, the $Si_aC_bN_c$ layer having an n-type conductivity and a thickness of 5 Å to 500 Å for the holes to be injected into the p-type III-nitride semiconductor layer by tunneling, and a p-side electrode formed on the $Si_aC_bN_c$ layer. According to the present invention, a $Si_aC_bN_c$ ($a \geq 0, b > 0, c > 0$) layer which can be doped with a high concentration is intervened between a p-type nitride semiconductor layer and a p-side electrode. Therefore, the present invention can solve the conventional problem.

6 Claims, 5 Drawing Sheets

U.S. PATENT DOCUMENTS

| | | | |
|---|---|---|---|
| 5,247,533 | A | 9/1993 | Okazaki et al. |
| 5,290,393 | A | 3/1994 | Nakamura |
| 5,306,662 | A | 4/1994 | Nakamura et al. |
| 5,338,944 | A * | 8/1994 | Edmond et al. ............... 257/76 |
| 5,563,422 | A | 10/1996 | Nakamura et al. |
| 5,733,796 | A | 3/1998 | Manabe et al. |
| 6,130,001 | A * | 10/2000 | Shi et al. .................... 428/690 |
| 6,194,743 | B1 | 2/2001 | Kondoh et al. |
| 6,410,944 | B1 | 6/2002 | Song |
| 2002/0179918 | A1* | 12/2002 | Sung et al. .................... 257/99 |
| 2003/0111666 | A1* | 6/2003 | Nishi et al. .................... 257/79 |

FOREIGN PATENT DOCUMENTS

| | | | |
|---|---|---|---|
| JP | 09-266351 | | 10/1997 |
| JP | 09-266352 | | 10/1997 |
| JP | H10-065212 | | 3/1998 |
| JP | H10-084159 | * | 3/1998 |
| KR | 10-0448352 | | 11/2003 |
| KR | 10-0432246 | | 5/2004 |
| WO | WO 02/21121 A1 | | 3/2002 |

* cited by examiner

III-NITRIDE SEMICONDUCTOR LIGHT EMITTING DEVICE

TECHNICAL FIELD

The present invention relates to a III-nitride semiconductor light emitting device, and more particularly, to a III-nitride semiconductor light emitting device in which contact resistance between a p-type nitride semiconductor layer and a p-side electrode adjacent to the p-type nitride semiconductor layer is reduced and holes are thus effectively supplied to an active layer. In this case, the III-nitride semiconductor light emitting device refers to a light emitting device such as a light emitting diode including an Al(x)Ga(y)In(1-x-y)N (0≦x≦1, 0≦y≦1, 0≦x+y≦1) compound semiconductor layer, but does not exclude semiconductor layers or materials made of elements of different groups, such as SiC, SiN, SiCN and CN.

BACKGROUND ART

FIG. 1 is a cross-sectional view illustrating the structure of a III-nitride semiconductor light emitting device in the prior art. The light emitting device includes a substrate 100, a buffer layer 200 epitaxially grown on the substrate 100, an n-type nitride semiconductor layer 300 epitaxially grown on the buffer layer 200, an active layer 400 epitaxially grown on the n-type nitride semiconductor layer 300, a p-type nitride semiconductor layer 500 epitaxially grown on the active layer 400, a p-side electrode 600 formed on the p-type nitride semiconductor layer 500, a aside bonding pad 700 formed on the p-side electrode 600, and an n-side electrode 800 formed on an n-type nitride semiconductor layer 301 which is exposed by mesa-etching at least the p-type nitride semiconductor layer 500 and the active layer 400.

The substrate 100 can use a GaN-based substrate as a homogeneous substrate, and a sapphire substrate, a silicon carbide substrate or a silicon substrate as a heterogeneous substrate, but can use any other substrates on which nitride semiconductor layers can be grown. If the silicon carbide substrate is used, the n-side electrode 800 can be formed on the opposite side of the silicon carbide substrate.

The nitride semiconductor layers epitaxially grown on the substrate 100 are usually grown by means of MOCVD (Metal Organic Chemical Vapor Deposition) method.

The buffer layer 200 serves to reduce differences in lattice constant and the coefficient of thermal expansion between the heterogeneous substrate 100 and the nitride semiconductor. U.S. Pat. No. 5,122,845 discloses a technology in which an AlN buffer layer having a thickness of 100 Å to 500 Å is grown on a sapphire substrate at a temperature ranging from 380° C. to 800° C. U.S. Pat. No. 5,290,393 discloses a technology in which an Al(x)Ga(1-x) N (0≦x<1) buffer layer having a thickness of 10 Å to 5000 Å is grown on a sapphire substrate at a temperature ranging from 200° C. to 900° C. Korean Patent No. 10-0448352 discloses a technology in which a SiC buffer layer is grown at a temperature ranging from 600° C. to 990° C., and an In(x)Ga(1-x)N (0<x≦1) layer is grown on the SiC buffer layer.

In the n-type nitride semiconductor layer 300, at least a region (n-type contact layer) in which the n-side electrode 800 is formed is doped with an impurity. The n-type contact layer is preferably made of GaN and is doped with Si. U.S. Pat. No. 5,733,796 discloses a technology in which an n-type contact layer is doped with a desired doping concentration by controlling a mixing ratio of Si and other source materials.

The active layer 400 is a layer for emitting a photon (light) by recombination of electrons and holes, and is mainly made of In(x)Ga(1-x)N (0<x<1). The active layer 400 is composed of a single quantum well or multi quantum wells. WO02/021121 discloses a technology in which only some of a plurality of quantum wells and barrier layers are doped.

The p-type nitride semiconductor layer 500 is doped with an impurity such as Mg, and has a p-type conductivity through an activation process. U.S. Pat. No.5,247,533 discloses a technology in which a p-type nitride semiconductor layer is activated by means of irradiation of electron beam. U.S. Pat. No.5,306,662 discloses a technology in which a p-type nitride semiconductor layer is activated through annealing at a temperature of 400° C. or more. Korean Patent No.10-0432246 discloses a technology in which NH3 and a hydrazine-based source material are used together as a nitrogen precursor for growing a p-type nitride semiconductor layer, so that the p-type nitride semiconductor layer has a p-type conductivity without an activation process.

The p-side electrode 600 serves to allow the current to be supplied to the entire p-type nitride semiconductor layer 500. U.S. Pat. No. 5,563,422 discloses a technology of a light-transmitting electrode, which is formed almost on the entire p-type nitride semiconductor layer, in ohmic contact with the p-type nitride semiconductor layer, and made of Ni and Au. Meanwhile, the p-side electrode 600 can be formed to have such a thick thickness that the p-side electrode 600 does not transmit light, i.e., the p-side electrode 600 reflects light toward the substrate. A light emitting device using this p-side electrode 600 is called a flip chip. U.S. Pat. No.6,194,743 discloses a technology of an electrode structure including an Ag layer of 20 nm or more in thickness, a diffusion barrier layer covering the Ag layer, and a bonding layer made of Au and Al, which covers the diffusion barrier layer.

In the III-nitride semiconductor light emitting device, the efficiency of a device can be defined as the ratio of the intensity of light generated to external input power. The p-type GaN constituting the p-type nitride semiconductor layer 500 is not good because it has a higher energy bandgap (~3.3 eV) and a doping efficiency of below $5\times10^{17}$ atoms/cm$^3$. Further, contact resistance between the p-type nitride semiconductor layer 500 and the p-side electrode 600 adjacent to the p-type nitride semiconductor layer 500 is very high. Accordingly, not only the efficiency of a device is not good, but also a higher voltage is needed in order to have the same intensity of light.

In order to reduce the contact resistance between the p-type nitride semiconductor layer 500 and the aside electrode 600, p-type GaN doped with a high concentration must be formed. It is, however, very difficult to form p-type GaN doped with a high concentration because of a great bandgap and a low doping efficiency (<$5\times10^{17}$ atoms/cm$^3$) of the p-type GaN.

A variety of methods have been proposed in order to reduce the contact resistance between the p-type GaN used as the p-type nitride semiconductor layer 500 and the p-side electrode 600. Among them, there is a method in which the p-type nitride semiconductor layer 500 is not made of a single p-type GaN layer, but is formed to have a superlattice structure of p-type GaN/p-type InGaN or p-type GaN/p-type AlGaN, and the concentration of holes, which is significantly higher than the concentration that can be obtained in the single p-type GaN layer, is thus obtained within the superlattice structure through piezoelectric field. This method, however, is not preferred because potential barrier is formed in a vertical direction within the superlattice structure before holes are injected into the active layer.

As another example, there is a method in which a GaAs layer or an AlGaAs layer is grown, which can be doped with a high concentration (>1020 atoms/cm3), between the p-type nitride semiconductor layer 500 and the p-side electrode 600 (U.S. Pat. No.6,410,944). In this method, however, since the bandgap of the GaAs layer or the AlGaAs layer is smaller than that of the visible region, most of light generated from the active layer 400 may be absorbed by the GaAs layer or the AlGaAs layer. Therefore, this method has limited application fields.

As described above, the conventional III-nitride semiconductor light emitting device is disadvantageous in that the efficiency is low because the contact resistance between the p-type nitride semiconductor layer 500 and the p-side electrode 600 is high. In this connection, there is a need for effective means for overcoming this problem.

DISCLOSURE

Technical Problem

Accordingly, the present invention has been made in view of the above problems occurring in the prior art, and it is an object of the present invention to provide a II-nitride semiconductor light emitting device having improved efficiency, in which contact resistance between a p-type nitride semiconductor layer and a p-side electrode formed on the p-type nitride semiconductor layer is reduced.

Technical Solution

To achieve the above object, according to the present invention, there is provided a III-nitride semiconductor light emitting device, including a plurality of III-nitride semiconductor layers including an active layer emitting light by recombination of electrons and holes, the plurality of III-nitride semiconductor layers having a p-type III-nitride semiconductor layer at the top thereof, an $Si_aC_bN_c$ ($a \geq 0, b > 0, c \geq 0, a+c > 0$) layer grown on the p-type III-nitride semiconductor layer, the $Si_aC_bN_c$ ($a \geq 0, b > 0, c \geq 0, a+c > 0$) layer having an n-type conductivity and a thickness of 5 Å to 500 Å for the holes to be injected into the p-type III-nitride semiconductor layer by tunneling, and a p-side electrode formed on the $Si_aC_bN_c$ ($a \geq 0, b > 0, c \geq 0, a+c > 0$) layer.

In the present invention, the thickness of the $Si_aC_bN_c$ ($a \geq 0, b > 0, c \geq 0, a+c > 0$) layer has a restriction, so that tunneling is efficiently accomplished. Also, when the $Si_aC_bN_c$ ($a \geq 0, b > 0, c \geq 0, a+c > 0$) layer is made of SiC, the degradation of the plurality of III-nitride semiconductor layers caused by decomposition of nitrogen therefrom during the growth of SiC layer is considered in this restriction.

In addition, according to the present invention, there is provided a III-nitride semiconductor light emitting device, including a plurality of III-nitride semiconductor layers including an active layer emitting light by recombination of electrons and holes, the plurality of III-nitride semiconductor layers having a p-type III-nitride semiconductor layer at the top thereof, a $Si_aC_bN_c$ ($a \geq 0, b > 0, c > 0$) layer grown on the p-type III-nitride semiconductor layer, and a p-side electrode formed on the $Si_aC_bN_c$ ($a \geq 0, b > 0, c > 0$) layer.

In the present invention, during the growth of the $Si_aC_bN_c$ ($a \geq 0, b > 0, c > 0$) layer, nitrogen is continuously supplied because the $Si_aC_bN_c$ ($a \geq 0, b > 0, c > 0$) layer includes nitrogen. Thus, the present invention has an additional advantage that the decomposition of nitrogen is prevented by the $Si_aC_bN_c$ ($a \geq 0, b > 0, c > 0$) layer.

In the present invention, the p-side electrode may be made of nickel and gold. The alloy of nickel and gold is the representative materials used for the p-side light-transmitting electrode of III-nitride semiconductor light emitting device.

In the present invention, the p-side electrode may be made of ITO (Indium Tin Oxide). Recently, ITO (Indium Tin Oxide) is widely used as a p-side electrode, but it is not easy to make a good ohmic contact with the p-type semiconductor using ITO (Indium Tin Oxide). The problem can be solved by using the $Si_aC_bN_c$ ($a \geq 0, b > 0, c \geq 0, a+c > 0$) layer with a high doping concentration.

Advantageous Effects

Generally, in III-nitride semiconductor light emitting devices, if a p-side electrode is formed directly on a p-type nitride semiconductor, high contact resistance is generated due to a high energy bandgap and low doping efficiency of the p-type nitride semiconductor. This makes the efficiency of the device degraded. According to the present invention, however, a $Si_aC_bN_c$ ($a \geq 0, b > 0, c \geq 0, a+c > 0$) layer which can be doped with a high concentration is intervened between a p-type nitride semiconductor and a p-side electrode. Therefore, the present invention can solve the conventional problem.

DESCRIPTION OF DRAWINGS

Further objects and advantages of the invention can be more fully understood from the following detailed description taken in conjunction with the accompanying drawings in which.

MODE FOR INVENTION

The present invention will now be described in detail in connection with preferred embodiments with reference to the accompanying drawings.

Figure 1:
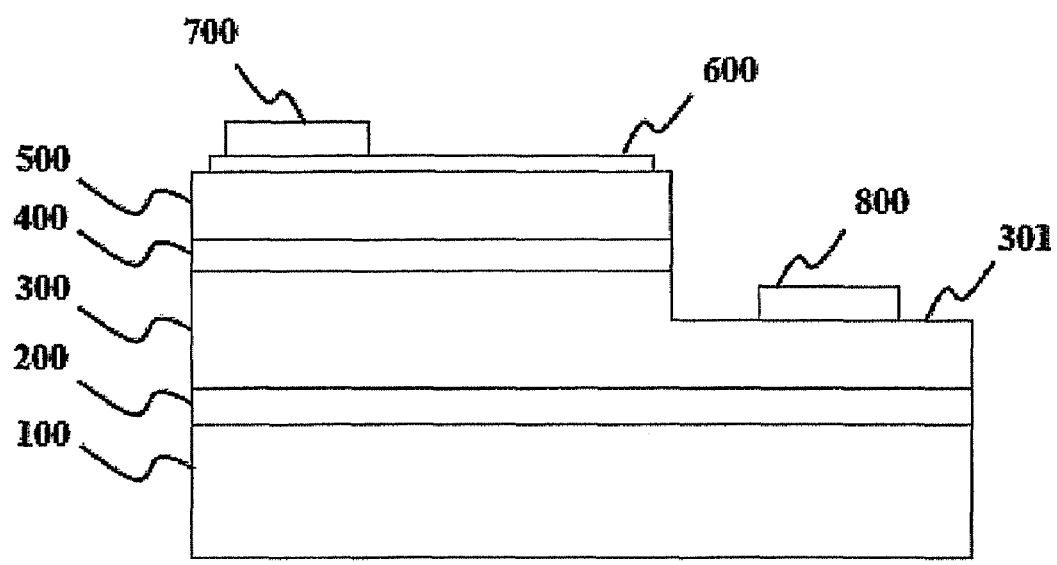
FIG. 1 is a cross-sectional view illustrating the structure of a III-nitride semiconductor light emitting device in the prior art.
Figure 2:
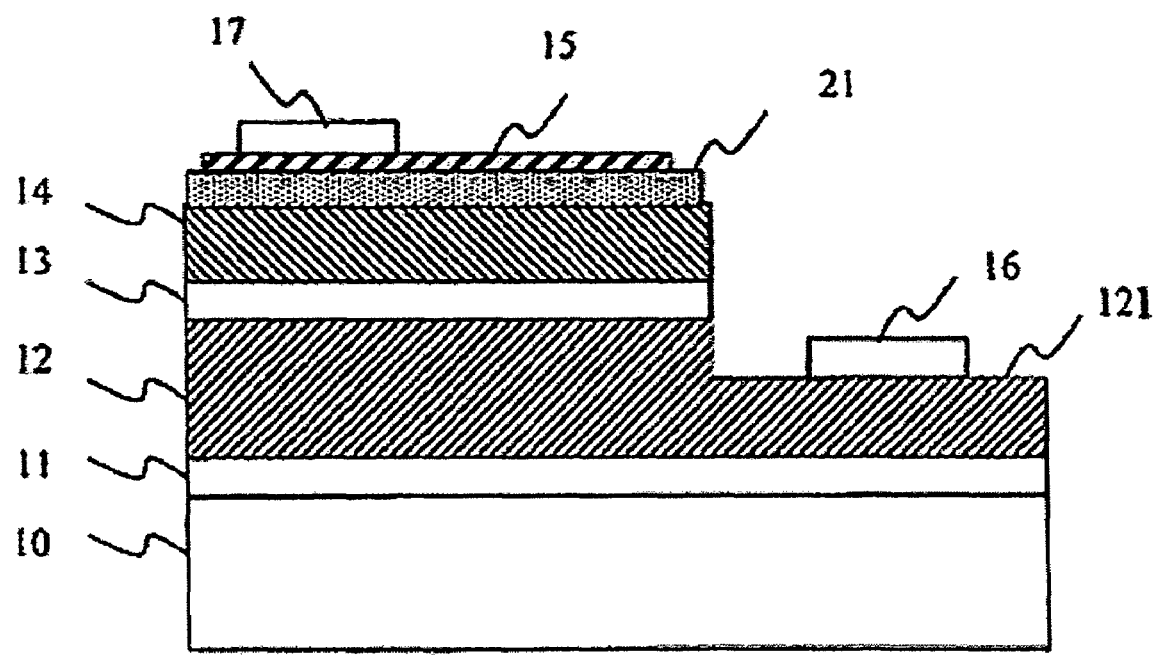
FIG. 2 is a cross-sectional view illustrating the structure of a III-nitride semiconductor light emitting device according to an embodiment of the present invention.

FIG. 2 is a cross-sectional view illustrating the structure of a III-nitride semiconductor light emitting device according to an embodiment of the present invention.

A buffer layer 11, an n-type nitride semiconductor layer 12, an active layer 13, and a p-type nitride semiconductor layer 14 are sequentially grown on a substrate 10. A p-side electrode 15 and a p-side bonding pad 17 are formed over the p-type nitride semiconductor layer 14. An n-side electrode 16 is formed on the n-type nitride semiconductor layer 121, which is exposed by mesa etching.

Referring to FIG. 2, unlike the prior art, according to the present invention, an n-type or p-type $Si_aC_bN_c$ ($a \geq 0, b > 0, c \geq 0, a+c > 0$) layer 21 is intervened between the p-type nitride semiconductor layer 14 and the p-side electrode 15.

$Si_aC_bN_c$ ($a \geq 0, b > 0, c \geq 0, a+c > 0$) includes silicon carbide [$Si_aC_bN_c$ ($a > 0, b > 0, c = 0$)], silicon carbon nitride [$Si_aC_bN_c$ ($a > 0, b > 0, c > 0$)]0 or carbon nitride [$Si_aC_bN_c$ ($a = 0, b > 0, c > 0$)], which are a group of materials having the similar properties.

In the $Si_aC_bN_c$ ($a \geq 0, b > 0, c \geq 0, a+c > 0$) layer 21, an n-type dopant such as Si, N, As or P and a p-type dopant such as B or Al can be easily doped at a high concentration of about $1 \times 10^{18}$ to $1 \times 10^{22}$ atoms/cm$^3$. Thus, the thickness of a potential barrier can be made thin so that holes can easily pass through the $Si_aC_bN_c$ ($a \geq 0, b > 0, c \geq 0, a+c > 0$) layer 21.

In FIG. 2, silicon carbide [$Si_aC_bN_c$ (a>0,b>0,c=0)] is used as the $Si_aC_bN_c$ (a≧0,b>0,c≧0,a+c>0) layer 21. The silicon carbide layer 21 can be obtained by allowing silicon and carbon to react to each other in a deposition apparatus. The silicon source material can include $SiH_4$, $Si_2H_6$, DTBSi, etc., and the carbon source material can include $CBr_4$, $C_xH_y$, etc.

Generally, the growth temperature of silicon carbide is over 1300° C. If silicon carbide is formed on a nitride semiconductor such as GaN at too high temperature, however, a GaN based device may be damaged when silicon carbide is grown. Therefore, the growth temperature of silicon carbide is preferably 600° C. to 1200° C.

Further, if the thickness of the silicon carbide layer becomes too thick, a tunneling barrier undesirably thickens. It is thus preferred that the thickness of the silicon carbide layer is about 5 Å to 500 Å. The doping concentration, thickness, and the growth temperature of the silicon carbide layer can be applied to formation of the silicon carbon nitride [$Si_aC_bN_c$ (a>0,b>0,c>0)] layer or the carbon nitride [$Si_aC_bN_c$ (a=0,b>0, c>0)] layer in the same manner as well as formation of the silicon carbide layer. In this case, $NH_3$ and/or hydrazine-based source can be mainly used as a nitrogen source material.

The p-side electrode 15 and the n-side electrode 16 can be made of at least one selected from the group consisting of nickel, gold, silver, chromium, titanium, platinum, palladium, rhodium, iridium, aluminum, tin, ITO (Indium Tin Oxide), indium, tantalum, copper, cobalt, iron, ruthenium, zirconium, tungsten, lanthanum and molybdenum.

Figure 3:
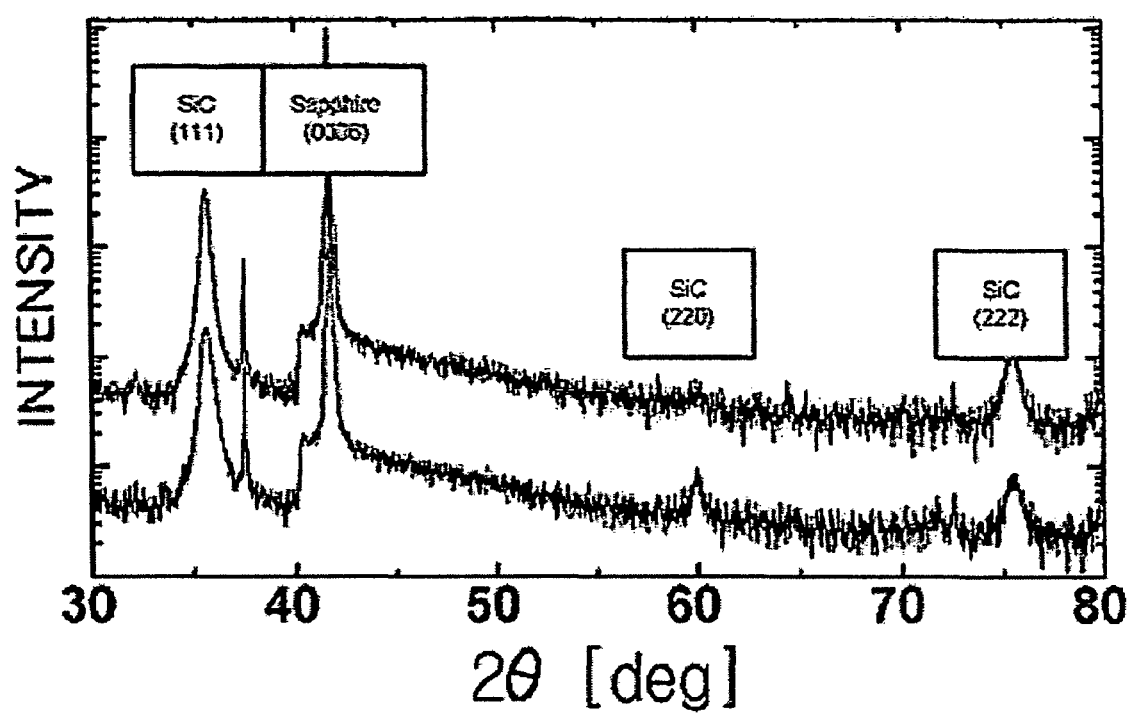
FIG. 3 is a graph showing X-ray diffraction (XRD) analysis of silicon carbide grown on a sapphire substrate.

FIG. 3 is a graph showing X-ray diffraction (XRD) analysis of silicon carbide grown on a sapphire substrate. In this case, the growth temperature was 1000° C. and the growth rate was 2 Å/sec. Further, the thickness of grown silicon carbide was 5000 Å for XRD analysis. $NH_3$ was used as a N source for high concentration n-type doping. At this time, the doping concentration was $4.63 \times 10^{19}$ atoms/cm$^3$ so that tunneling can occur sufficiently. From FIG. 3, it can be seen that silicon carbide is well grown.

Table 1 shows electrical characteristics of a device, which is formed by growing silicon carbide of about 20 Å in thickness, which is doped with a high concentration, on a common GaN-based light emitting device. At this time, an electrode used was an ITO(Indium Tin Oxide) electrode. From Table 1, it can be seen that a case where a silicon carbide layer is formed has a low contact resistance value compared to a case where an electrode is formed on p-type GaN without silicon carbide layer.

TABLE 1

| | CONTACT LAYER | Vf@20 mA[V] | Vf@10 μA[V] | Vr@-10 μA[V] |
|---|---|---|---|---|
| case 1 | p-GaN | 5.25 | 2.37 | 24.1 |
| case 2 | SiC/p-GaN | 3.65 | 2.35 | 25.1 |

Figure 4:
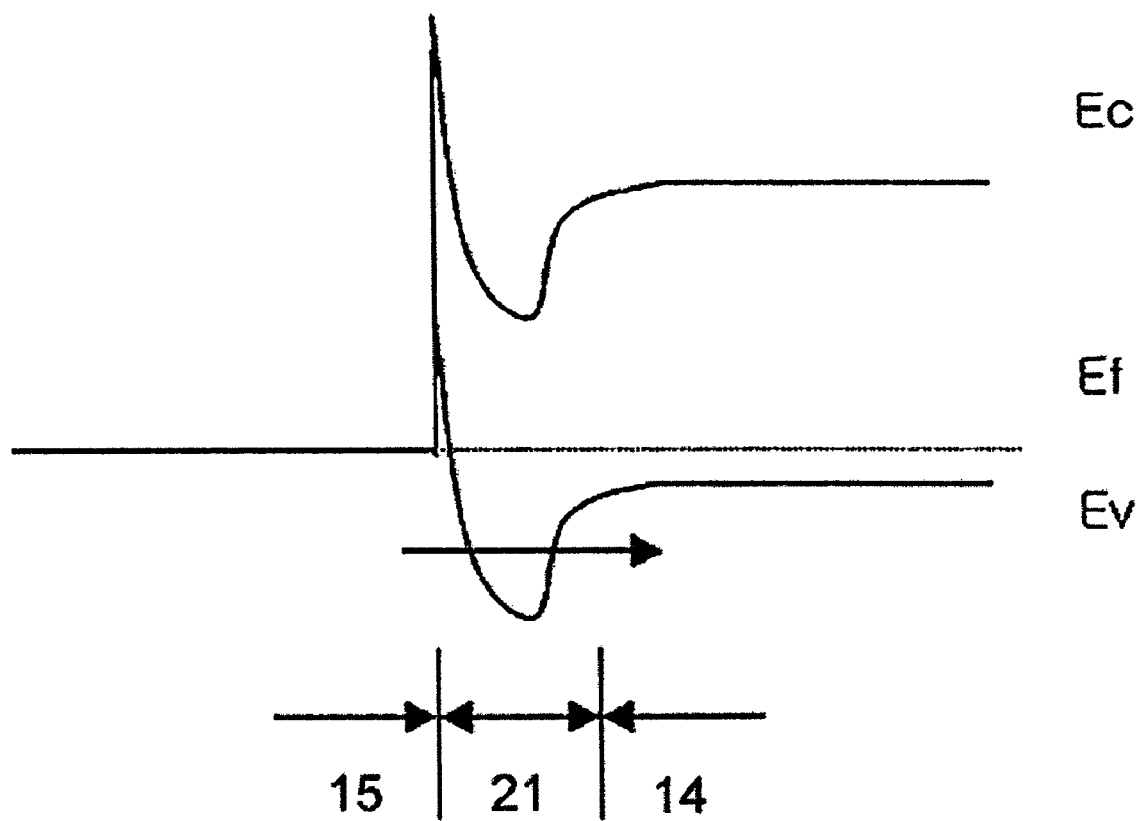
FIG. 4 shows an energy band diagram of a metal/n-type SiC/p-type GaN structure.

FIG. 4 shows a schematic energy band diagram when the n-type silicon carbide layer 21 exits between the p-type nitride semiconductor layer 14 and the p-side electrode 15.

From FIG. 4, it can be seen that holes can flow into the p-type nitride semiconductor layer 14 in a more efficient manner since the n-type silicon carbide layer 21 doped with a high concentration exists ($E_C$: Conduction Band Energy, $E_V$: Valence Band Energy, $E_F$: Fermi Energy Level).

Figure 5:
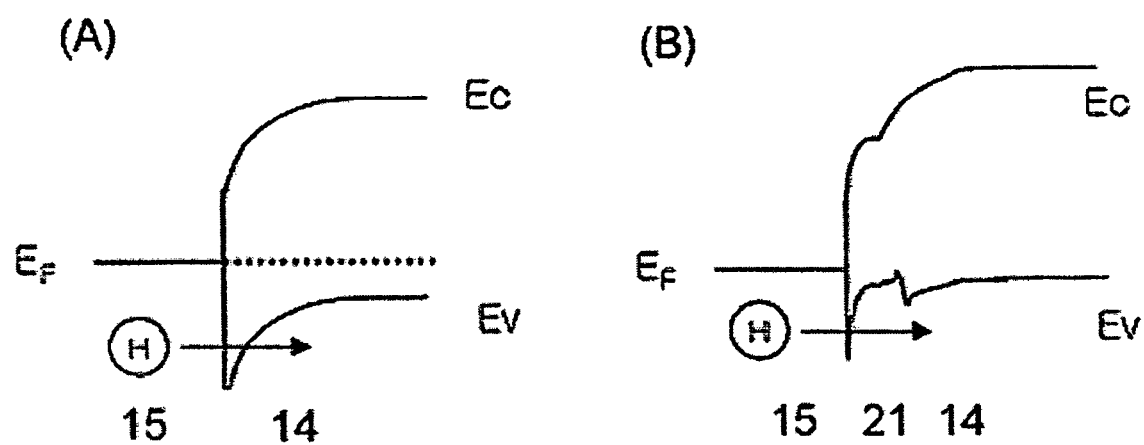
FIG. 5 shows an energy band diagram for explaining the operational principle of the metal/p-type SiC/p-type GaN structure.

FIG. 5 shows a schematic energy band diagram in the case (a) where the p-side electrode 15 is formed on the p-type nitride semiconductor layer 14 and the case (b) where a p-type silicon carbide layer doped with a high concentration exists between the p-type nitride semiconductor layer 14 and the p-side electrode 15. From FIG. 5, it can be seen that holes H can flow into the p-type nitride semiconductor layer 14 in a more efficient manner in the case where there exists the p-type silicon carbide layer doped with the high concentration ($E_C$: Conduction Band Energy, $E_V$: Valence Band Energy, $E_F$: Fermi Energy Level).

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The invention claimed is:

1. A III-nitride semiconductor light emitting device comprising:
a plurality of III-nitride semiconductor layers including an active layer emitting light by recombination of electrons and holes, the plurality of III-nitride semiconductor layers having a p-type III-nitride semiconductor layer at the top thereof,
a $Si_aC_bN_c$ (a≧0,b>0,c>0) layer grown on the p-type III-nitride semiconductor layer, wherein the $Si_aC_bN_c$ (a≧0, b>0,c>0) layer has an n-type conductivity and a thickness of 5 Å to 500 Å for the holes to be injected into the p-type III-nitride semiconductor layer by tunneling, and
a p-side electrode formed on the $Si_aC_bN_c$ (a≧0,b>0,c>0) layer.

2. The III-nitride semiconductor light emitting device of claim 1, wherein growth temperature of a $Si_aC_bN_c$ (a≧0,b>0, c>0) layer is in a range from 600° C. to 1200° C.

3. The III-nitride semiconductor light emitting device of claim 1, wherein the doping concentration of the $Si_aC_bN_c$ (a≧0,b>0,c>0) layer is in a range from $1 \times 10^{18}$ to $1 \times 10^{22}$ atoms/cm$^3$.

4. The III-nitride semiconductor light emitting device of claim 1, wherein the p-side electrode is made of nickel and gold.

5. The III-nitride semiconductor light emitting device of claim 1, wherein the p-side electrode is made of ITO(Indium Tin Oxide).

6. The III-nitride semiconductor light emitting device of claim 1, wherein the p-side electrode is made of at least one selected from the group consisting of nickel, gold, silver, chromium, titanium, platinum, palladium, rhodium, iridium, aluminum, tin, ITO(Indium Tin Oxide), indium, tantalum, copper, cobalt, iron, ruthenium, zirconium, tungsten, lanthanum and molybdenum.

* * * * *